US012588572B2

(12) United States Patent
Shin et al.

(10) Patent No.: US 12,588,572 B2
(45) Date of Patent: Mar. 24, 2026

(54) SEMICONDUCTOR DEVICE AND METHOD OF FORMING FINE PITCH CONDUCTIVE POSTS WITH GRAPHENE-COATED CORES

(71) Applicant: STATS ChipPAC Pte. Ltd., Singapore (SG)

(72) Inventors: YongMoo Shin, Incheon (KR); HeeSoo Lee, Incheon (KR); SeungHyun Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 443 days.

(21) Appl. No.: 18/184,649

(22) Filed: Mar. 15, 2023

(65) Prior Publication Data

US 2024/0312884 A1 Sep. 19, 2024

(51) Int. Cl.
*H01L 23/498* (2006.01)
*H01L 21/56* (2006.01)
(Continued)

(52) U.S. Cl.
CPC ...... *H01L 23/49811* (2013.01); *H01L 21/563* (2013.01); *H01L 23/3128* (2013.01); *H01L 25/18* (2013.01)

(58) Field of Classification Search
CPC .................................................. H01L 23/49877
See application file for complete search history.

(56) References Cited

U.S. PATENT DOCUMENTS 6,114,413 A 9/2000 Kang et al.
7,659,145 B2 2/2010 Do et al.
(Continued)

FOREIGN PATENT DOCUMENTS

CN 102867793 A 1/2013
CN 110071074 A 7/2019
(Continued)

OTHER PUBLICATIONS

Graphmatech, "Graphmatech's Graphene Technology Unlocks the Potential of Copper Additive Manufacturing" Website: https://graphmatech.com/graphmatechs-graphene-technology-unlocks-the-potential-of-copper-additive-manufacturing/, Feb. 9, 2021, Uppsala, Sweden.

(Continued)

*Primary Examiner* — Dale E Page
*Assistant Examiner* — Rohit Parthasarathy
(74) *Attorney, Agent, or Firm* — Robert D. Atkins; PATENT LAW GROUP

(57) ABSTRACT

A semiconductor device has a substrate and an electrical component disposed over a first surface of the substrate. A first encapsulant is deposited over the first surface of the substrate. A second encapsulant is deposited over a second surface of the substrate with a via formed in the second encapsulant. A conductive material containing a graphene core shell is deposited in the via in the second encapsulant to form a conductive post. The graphene core shell can have a copper core with a graphene coating formed over the copper core. The conductive material has a matrix to embed the graphene core shell. The conductive material can have a plurality of cores covered by graphene and the graphene is interconnected within the conductive material to form an electrical path. The conductive material can have thermoset material or polymer or composite epoxy type matrix to embed the graphene core shell.

21 Claims, 14 Drawing Sheets

(51) Int. Cl.
　　 *H01L 23/31* 　　 (2006.01)
　　 *H01L 25/18* 　　 (2023.01)

(56) References Cited

U.S. PATENT DOCUMENTS

| | | | |
|---|---|---|---|
| 7,700,943 B2 | 4/2010 | Raravikar et al. | |
| 7,886,813 B2 | 2/2011 | Hua et al. | |
| 7,989,707 B2 | 8/2011 | Yamano et al. | |
| 8,106,495 B2 | 1/2012 | Kajiki | |
| 8,107,242 B2 | 1/2012 | Yoshimoto et al. | |
| 8,263,439 B2 | 9/2012 | Marimuthu et al. | |
| 8,421,232 B2 | 4/2013 | Ikeda et al. | |
| 8,535,553 B2 * | 9/2013 | Kong | B82Y 40/00 |
| | | | 216/83 |
| 8,623,753 B1 * | 1/2014 | Yoshida | H01L 25/105 |
| | | | 257/690 |
| 8,643,185 B2 | 2/2014 | Kajiwara et al. | |
| 8,710,649 B1 | 4/2014 | Huemoeller et al. | |
| 8,927,334 B2 | 1/2015 | Daubenspeck et al. | |
| 9,070,677 B2 | 6/2015 | Park | |
| 9,105,613 B1 * | 8/2015 | Chen | H05K 3/284 |
| 9,144,183 B2 | 9/2015 | Chen et al. | |
| 9,202,742 B1 | 12/2015 | Kim et al. | |
| 9,305,854 B2 | 4/2016 | Shim et al. | |
| 9,337,073 B2 | 5/2016 | Liu et al. | |
| 9,406,533 B2 * | 8/2016 | Chi | H01L 23/49822 |
| 9,576,922 B2 | 2/2017 | Brunschwiler et al. | |
| 9,698,075 B2 | 7/2017 | Venugopal et al. | |
| 9,780,071 B2 | 10/2017 | Lee et al. | |
| 9,859,200 B2 | 1/2018 | Park et al. | |
| 9,916,989 B2 | 3/2018 | Yoon et al. | |
| 10,287,471 B2 | 5/2019 | Zhang et al. | |
| 10,322,472 B2 | 6/2019 | Hattori et al. | |
| 10,340,154 B2 | 7/2019 | Kamikoriyama et al. | |
| 10,421,123 B2 * | 9/2019 | Jeong | B22F 3/10 |
| 10,510,733 B2 | 12/2019 | Kumar et al. | |
| 10,566,104 B2 * | 2/2020 | Lee | B22F 1/0547 |
| 10,600,743 B2 | 3/2020 | Lee et al. | |
| 10,784,181 B2 | 9/2020 | Fu et al. | |
| 10,854,549 B2 | 12/2020 | Nakano | |
| 10,867,936 B2 | 12/2020 | Wang et al. | |
| 10,872,879 B2 * | 12/2020 | Kim | H01L 21/4853 |
| 11,437,308 B2 | 9/2022 | Rho et al. | |
| 11,652,060 B2 | 5/2023 | Gomes et al. | |
| 11,810,844 B2 | 11/2023 | Mok | |
| 12,388,029 B2 | 8/2025 | Yim et al. | |
| 2002/0104669 A1 * | 8/2002 | Underwood | H05K 9/0039 |
| | | | 174/370 |
| 2006/0007661 A1 | 1/2006 | Iketaki | |
| 2009/0096100 A1 * | 4/2009 | Kajiwara | H01L 23/49562 |
| | | | 252/512 |
| 2009/0152715 A1 | 6/2009 | Shim et al. | |
| 2010/0109688 A1 | 5/2010 | Eldridge et al. | |
| 2010/0129648 A1 | 5/2010 | Xu et al. | |
| 2011/0006425 A1 * | 1/2011 | Wada | H01L 21/76877 |
| | | | 977/734 |
| 2012/0018897 A1 | 1/2012 | Park et al. | |
| 2012/0132930 A1 | 5/2012 | Young et al. | |
| 2013/0056703 A1 | 3/2013 | Elian et al. | |
| 2013/0075923 A1 * | 3/2013 | Park | H01L 21/563 |
| | | | 257/774 |

| | | | |
|---|---|---|---|
| 2013/0082364 A1 | 4/2013 | Wang et al. | |
| 2014/0024211 A1 | 1/2014 | Ott et al. | |
| 2014/0103527 A1 | 4/2014 | Mariumuthu et al. | |
| 2015/0179602 A1 | 6/2015 | Camacho et al. | |
| 2016/0039662 A1 | 2/2016 | Lin et al. | |
| 2016/0137507 A1 | 5/2016 | You et al. | |
| 2016/0286698 A1 * | 9/2016 | Chang | B32B 27/14 |
| 2017/0033086 A1 | 2/2017 | Homma et al. | |
| 2017/0130034 A1 | 5/2017 | Hwang et al. | |
| 2017/0167716 A1 | 6/2017 | Ezaki et al. | |
| 2018/0323170 A1 * | 11/2018 | Kim | H01L 21/56 |
| 2018/0346679 A1 | 12/2018 | Shishkin et al. | |
| 2019/0139902 A1 | 5/2019 | Lee et al. | |
| 2019/0181082 A1 | 6/2019 | Chen et al. | |
| 2019/0206839 A1 | 7/2019 | Balakrishnan et al. | |
| 2019/0259685 A1 | 8/2019 | Hussain et al. | |
| 2019/0348344 A1 | 11/2019 | Lu et al. | |
| 2019/0382627 A1 * | 12/2019 | Hu | H01B 1/128 |
| 2019/0394898 A1 | 12/2019 | Manninen et al. | |
| 2020/0002176 A1 | 1/2020 | Gorton | |
| 2020/0075502 A1 | 3/2020 | Kim et al. | |
| 2020/0161252 A1 * | 5/2020 | Yang | H01L 21/568 |
| 2020/0227338 A1 | 7/2020 | Gong | |
| 2020/0388552 A1 * | 12/2020 | Chou | H01L 23/49877 |
| 2021/0005512 A1 * | 1/2021 | Liu | H01L 21/56 |
| 2021/0028122 A1 | 1/2021 | Son et al. | |
| 2021/0151357 A1 | 5/2021 | Cook et al. | |
| 2021/0257346 A1 | 8/2021 | Baloglu et al. | |
| 2022/0002157 A1 | 1/2022 | Corrigan et al. | |
| 2022/0068703 A1 * | 3/2022 | Bao | H01L 23/53204 |
| 2022/0352398 A1 | 11/2022 | Munshi et al. | |
| 2022/0359418 A1 | 11/2022 | Jung et al. | |
| 2023/0320106 A1 | 10/2023 | Mun | |
| 2023/0323067 A1 | 10/2023 | Yoshida et al. | |
| 2024/0096736 A1 * | 3/2024 | Shin | H01L 25/165 |
| 2024/0128200 A1 * | 4/2024 | Shin | H01L 23/3121 |
| 2024/0153783 A1 * | 5/2024 | Lee | H01L 23/49811 |
| 2024/0194628 A1 * | 6/2024 | Shin | H01L 24/83 |
| 2024/0194629 A1 * | 6/2024 | Shin | H01L 25/0652 |
| 2024/0213328 A1 | 6/2024 | Bejugam et al. | |
| 2024/0234291 A1 * | 7/2024 | Shin | H01L 23/49894 |
| 2024/0234292 A1 * | 7/2024 | Shin | H01L 25/162 |
| 2024/0312884 A1 * | 9/2024 | Shin | H01L 25/105 |
| 2024/0321768 A1 * | 9/2024 | Shin | H01L 21/565 |
| 2024/0332035 A1 * | 10/2024 | Shin | H01L 25/0657 |
| 2024/0413095 A1 * | 12/2024 | Shin | H01L 24/13 |

FOREIGN PATENT DOCUMENTS

| | | | |
|---|---|---|---|
| KR | 101465616 B1 | 11/2014 | |
| KR | 20150142090 A | 12/2015 | |
| KR | 10-1895114 | 9/2018 | |
| KR | 10-2395247 | 5/2022 | |
| TW | 202134169 A | 9/2021 | |
| WO | 2022113729 A1 | 6/2022 | |

OTHER PUBLICATIONS

Yu Seong Lee, Laser-Sintered Silver Nanoparticles as a Die Adhesive Layer for High-Power Light-Emitting Diodes, IEEE Transactions on Components, Packaging and Manufacturing Technology. vol. 4, No. 7, Jul. 2014, pp. 1119-1124.

* cited by examiner

SEMICONDUCTOR DEVICE AND METHOD OF FORMING FINE PITCH CONDUCTIVE POSTS WITH GRAPHENE-COATED CORES

FIELD OF THE INVENTION

The present invention relates in general to semiconductor devices and, more particularly, to a semiconductor device and method of forming conductive posts with graphene Cu core shells for a DSmSiP.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices may contain multiple electrical components, e.g. semiconductor die and discrete components, disposed on a substrate to perform necessary electrical functions. Such a package is commonly referred to as a system-in-package (SIP) module or dual-side molding system-in-package (DSmSiP). The substrate may have multiple layers and conductive posts to accommodate the often complex interconnect function. The lamination to protect the conductive posts can cause warpage and deviation between post areas and no-post areas, leading to defects in later manufacturing processes, e.g. with top surface mount technology.

In addition, there is an increasing demand for high density packages, i.e., less than 300 μm bump pitch. Unfortunately, high density and fine pitch increases the chance for bump shorts. A need exists for high density, low pitch electrical interconnect with high signal transmission, but without warpage and electrical shorting issues to accommodate next generation of DSmSiP.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
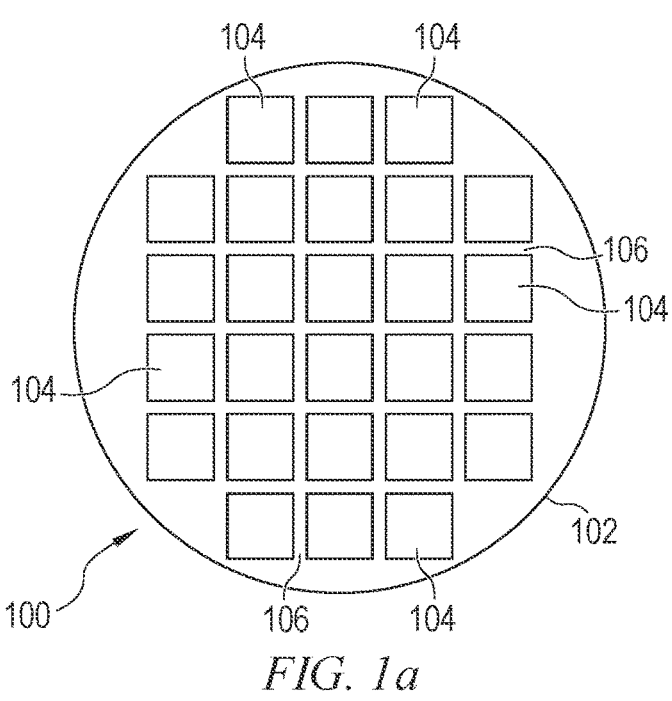
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Alternatively, wafer 100 can be a mold surface, organic or inorganic substrate, or target substrate suitable for graphene transfer.

Figure 1B:
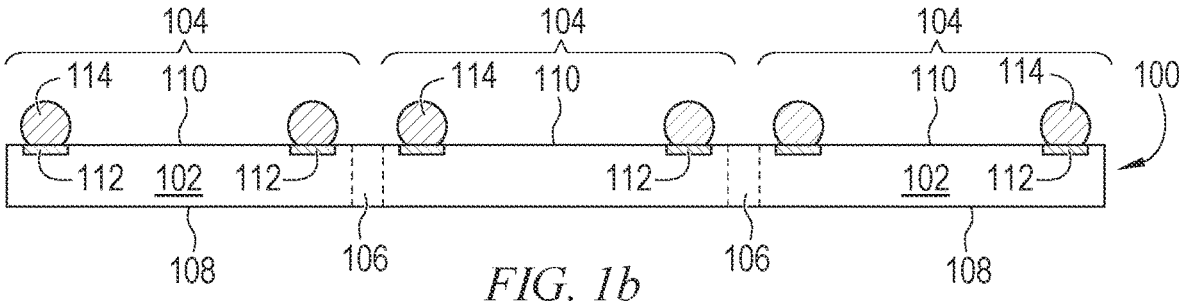

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
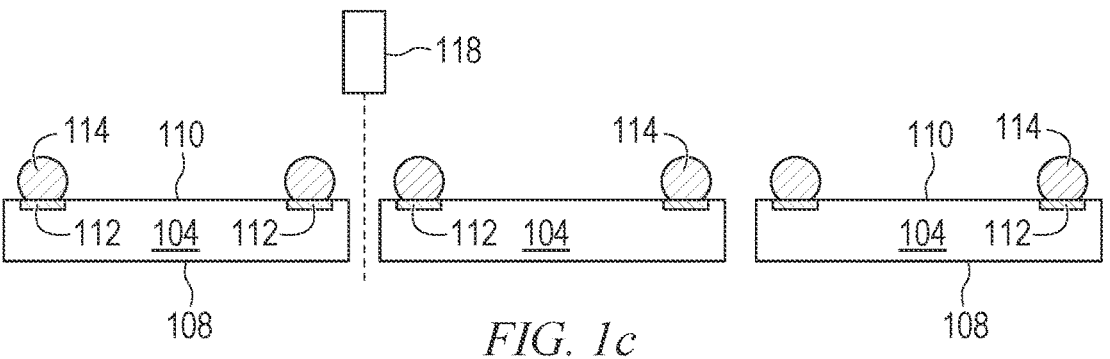

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figure 2A:
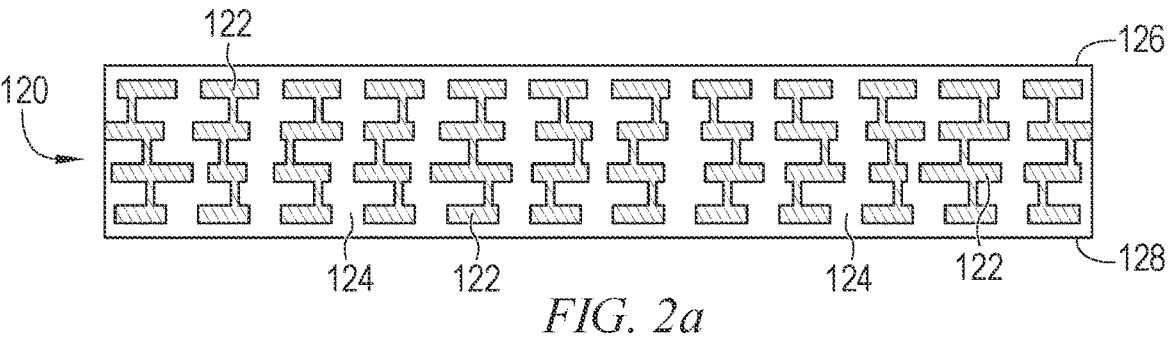
FIGS. 2a-2j illustrate a process of forming conductive posts with graphene Cu core shells for a DSmSiP.

FIGS. 2a-2j illustrate a process of forming conductive posts with a graphene Cu core for a DSmSiP. FIG. 2a shows a cross-sectional view of multi-layered interconnect substrate 120 including conductive layers 122 and insulating layers 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layers 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layers 124 provides isolation between conductive layers 122.

Figure 2B:
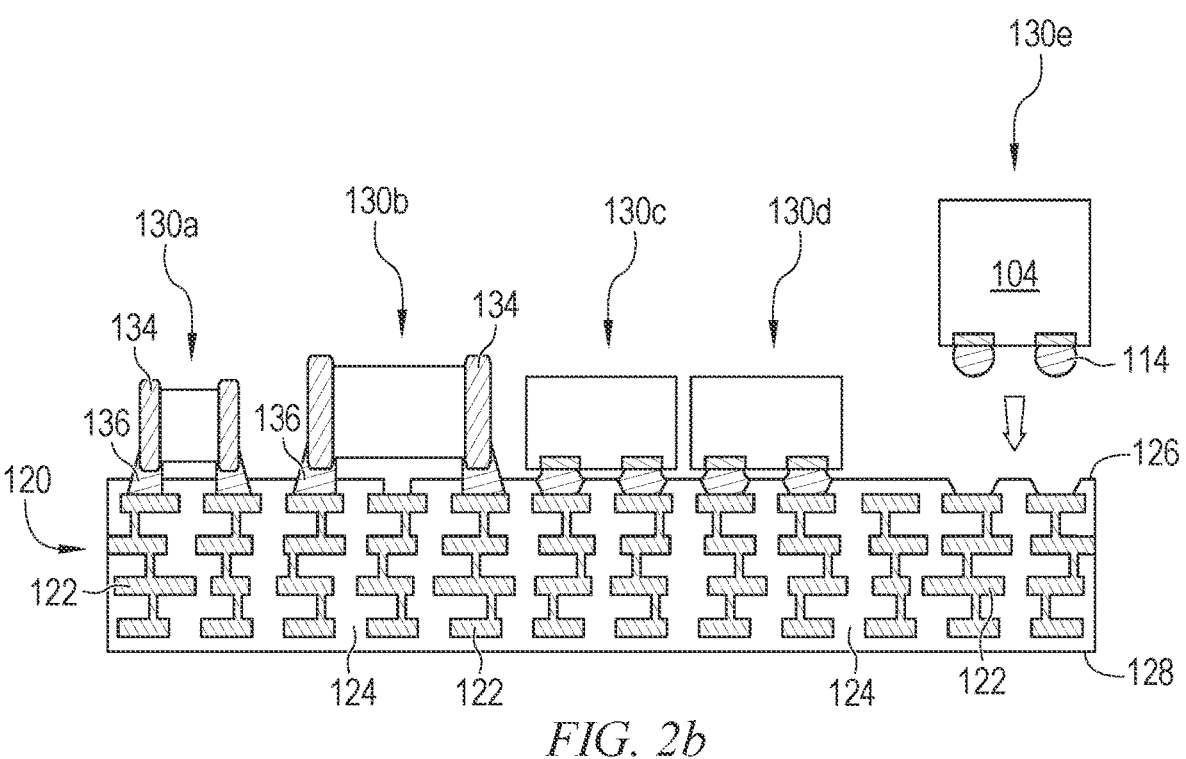

In FIG. 2b, electrical components 130a-130e are disposed on surface 126 of interconnect substrate 120 and electrically and mechanically connected to conductive layers 122. For example, electrical components 130a and 130b can be discrete electrical devices, or IPDs, such as a diode, transistor, resistor, capacitor, and inductor. Electrical component 130c, 130d, and 130e can be, or similar to, semiconductor die 104 from FIG. 1c with bumps 114 oriented toward surface 126 of substrate 120. Alternatively, electrical components 130a-130e can include other semiconductor die, semiconductor packages, surface mount devices, RF components, discrete electrical devices, or integrated passive devices (IPD).

Figure 2C:
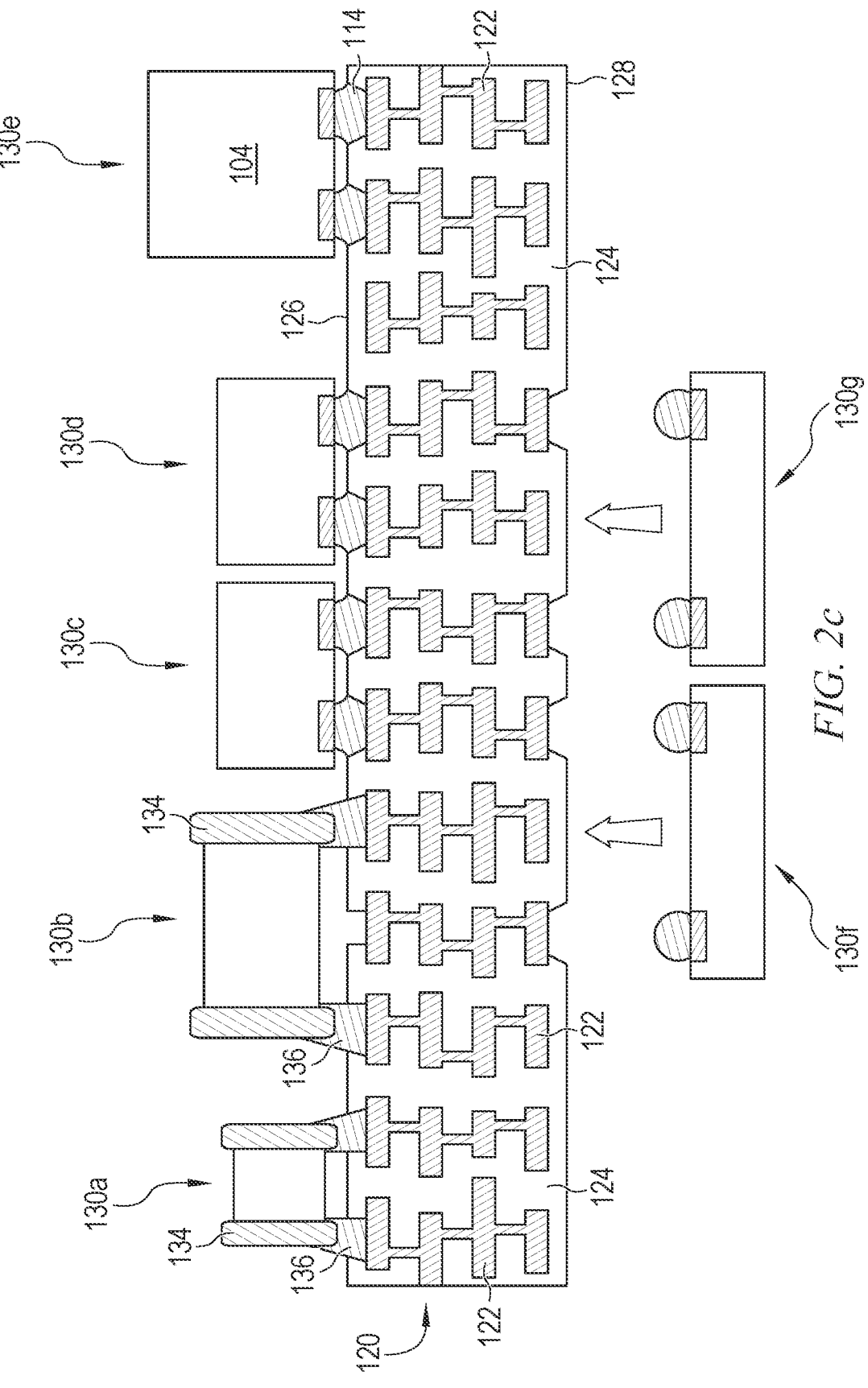

Electrical components 130a-130e are positioned over surface 126 of substrate 120 using a pick and place operation. Electrical components 130a-130e are brought into contact with conductive layer 122 on surface 126 of substrate 120. Terminals 134 of electrical components 130a and 130b are electrically and mechanically connected to conductive layer 122 using solder or conductive paste 136. Electrical components 130c-130e are electrically and mechanically connected to conductive layer 122 by reflowing bumps 114. FIG. 2c illustrates electrical components 130a-130e electrically and mechanically connected to conductive layers 122 on surface 126 of substrate 120. In a similar manner, electrical components 130f and 130g are disposed on surface 128 of interconnect substrate 120 and electrically and mechanically connected to conductive layers 122. Electrical components 130f-130g can include semiconductor die, semiconductor packages, surface mount devices, RF components, discrete electrical devices, or IPD, as described for electrical components 130a-130e.

Figure 2D:
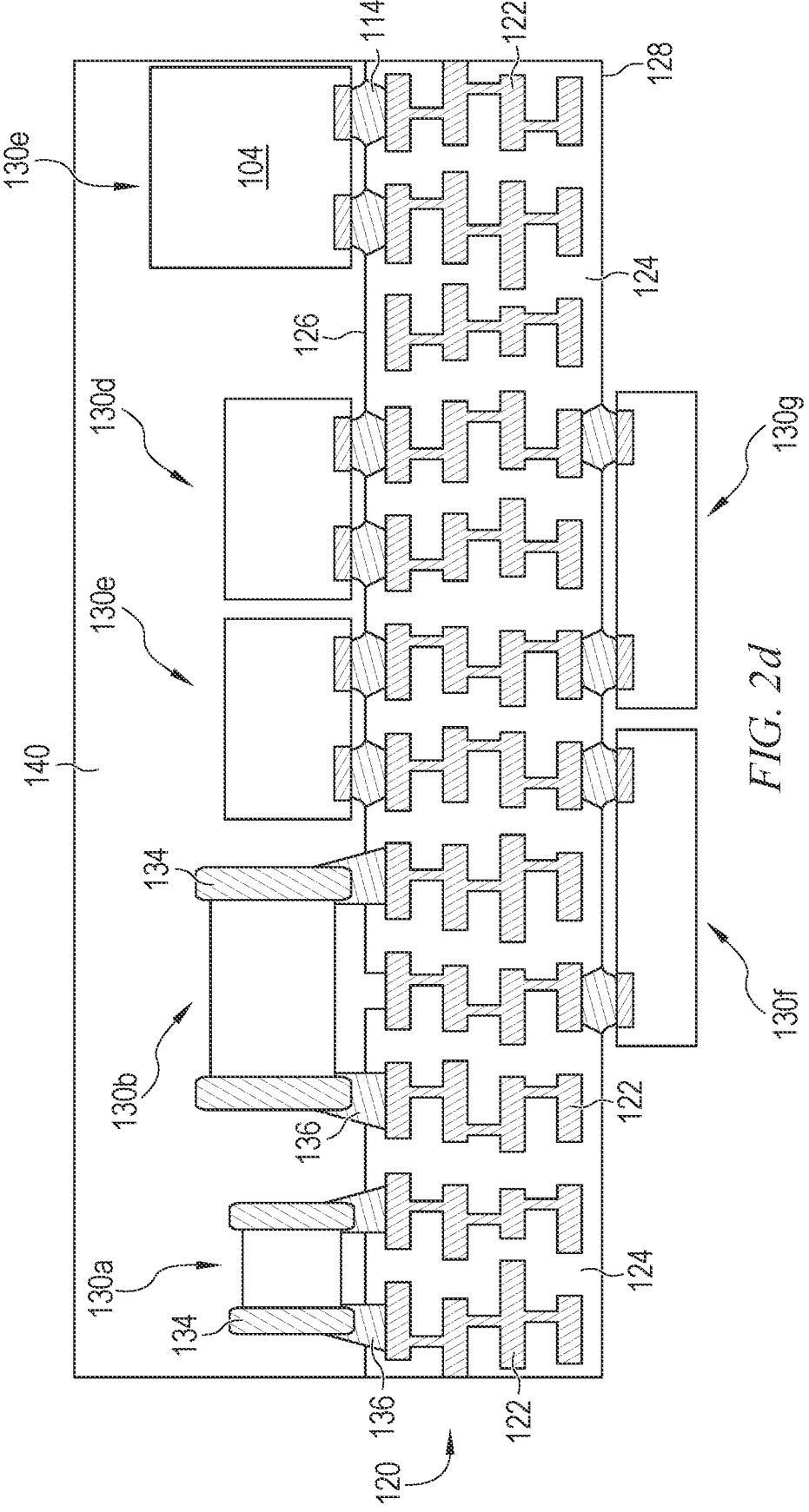

In FIG. 2d, encapsulant or molding compound 140 is deposited over and around electrical components 130a-130e and surface 126 of substrate 120 using a paste printing, compressive molding, transfer molding, liquid encapsulant molding, vacuum lamination, spin coating, or other suitable applicator. Encapsulant 140 can be liquid or granular polymer composite material, such as epoxy resin with filler, epoxy acrylate with filler, or polymer with proper filler. Encapsulant 140 is non-conductive, provides structural support, and environmentally protects the semiconductor device from external elements and contaminants.

Figure 2E:
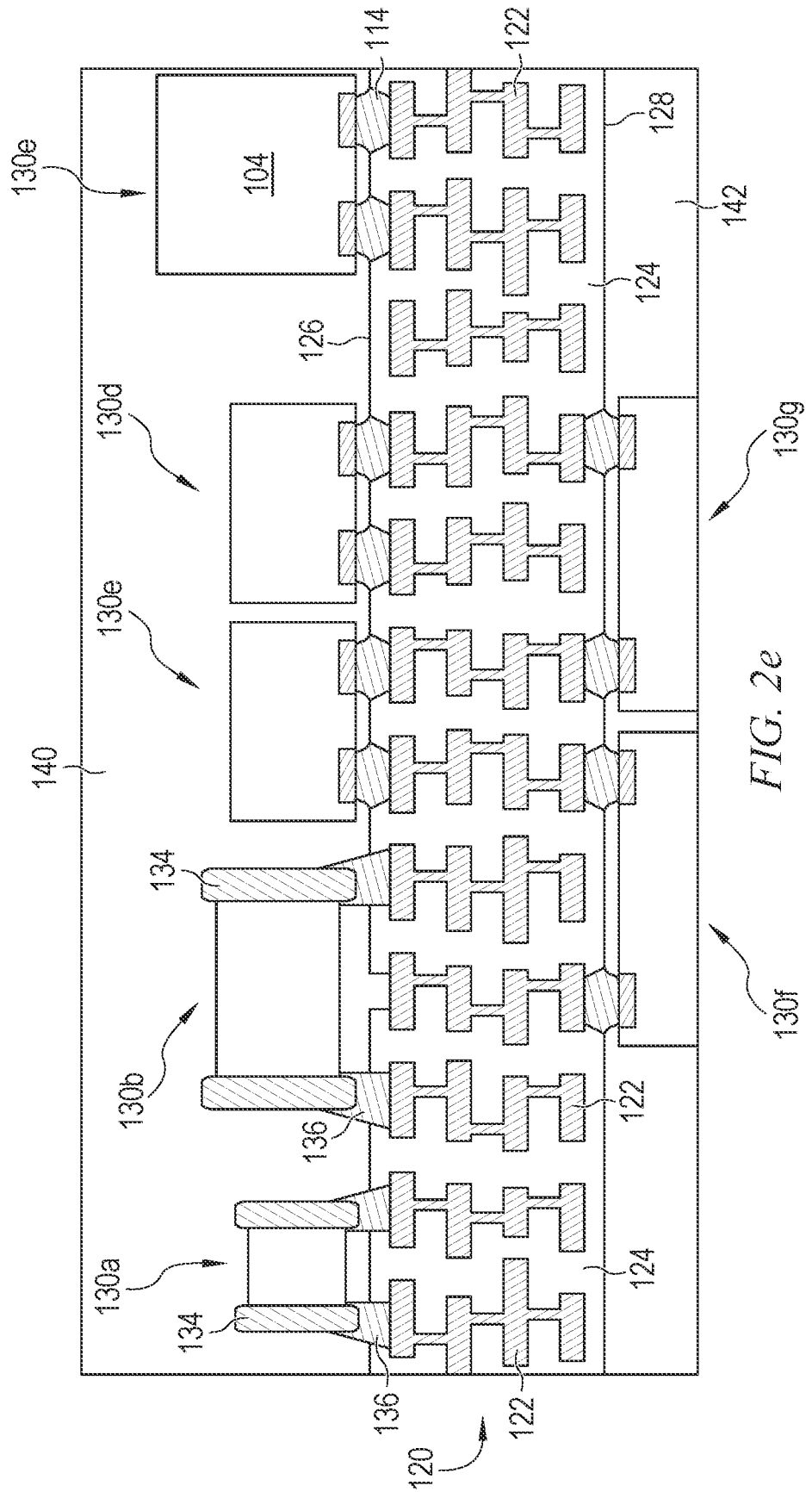

In FIG. 2e, encapsulant or molding compound 142 is deposited over and around electrical components 130f-130g and surface 128 of substrate 120 using a paste printing, compressive molding, transfer molding, liquid encapsulant molding, vacuum lamination, spin coating, or other suitable applicator. Encapsulant 142 can be liquid or granular polymer composite material, such as epoxy resin with filler, epoxy acrylate with filler, or polymer with proper filler. Encapsulant 142 is non-conductive, provides structural support, and environmentally protects the semiconductor device from external elements and contaminants.

Figure 2F:
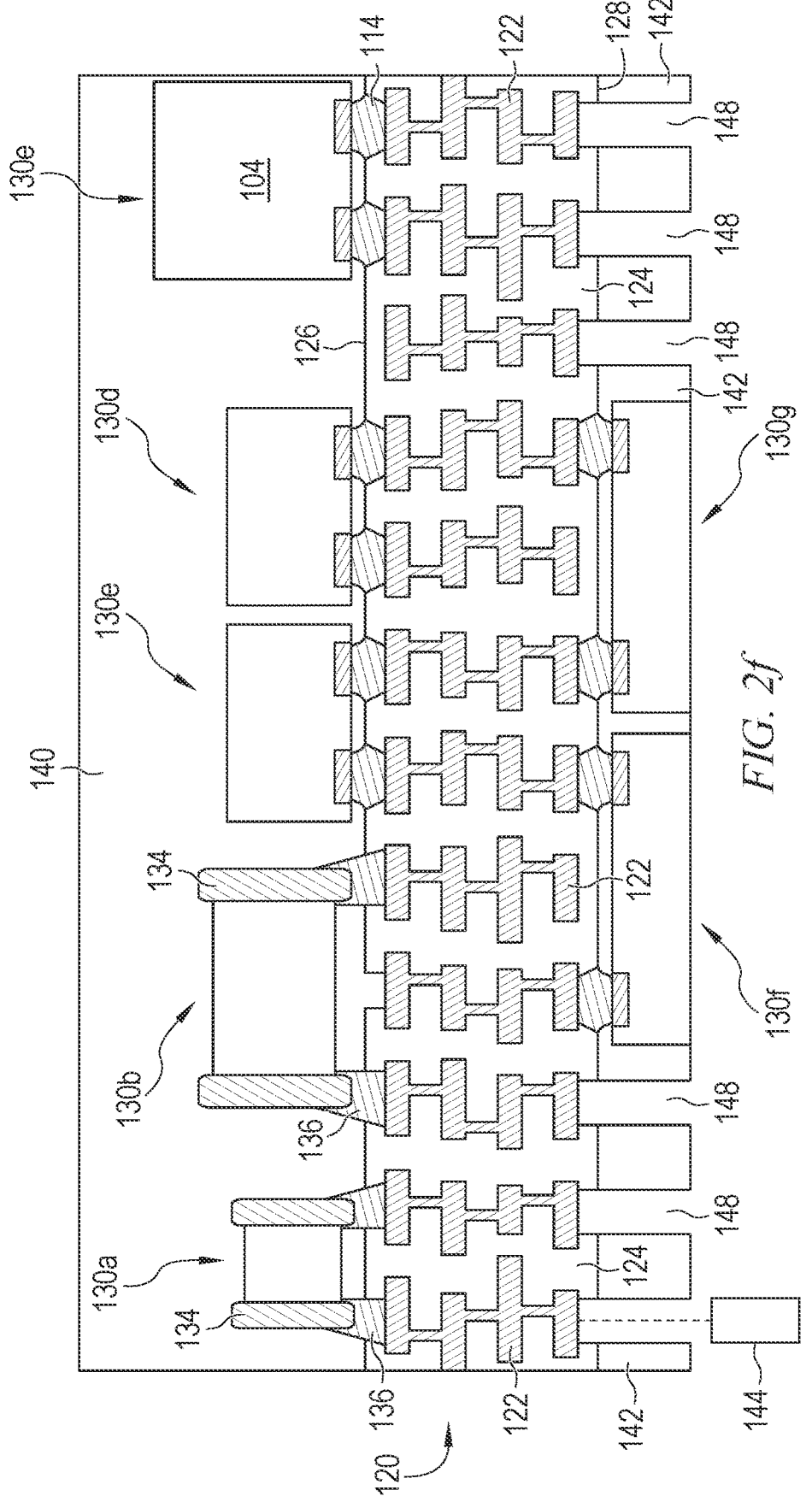

In FIG. 2f, a portion of encapsulant 142 is removed by etching or LDA using laser 144 to form via or opening 148 and expose conductive layer 122. Vias 148 have a diameter or width of 50-70 μm and pitch of less 300 μm, preferably in the range of 100-140 μm.

Figure 2G:
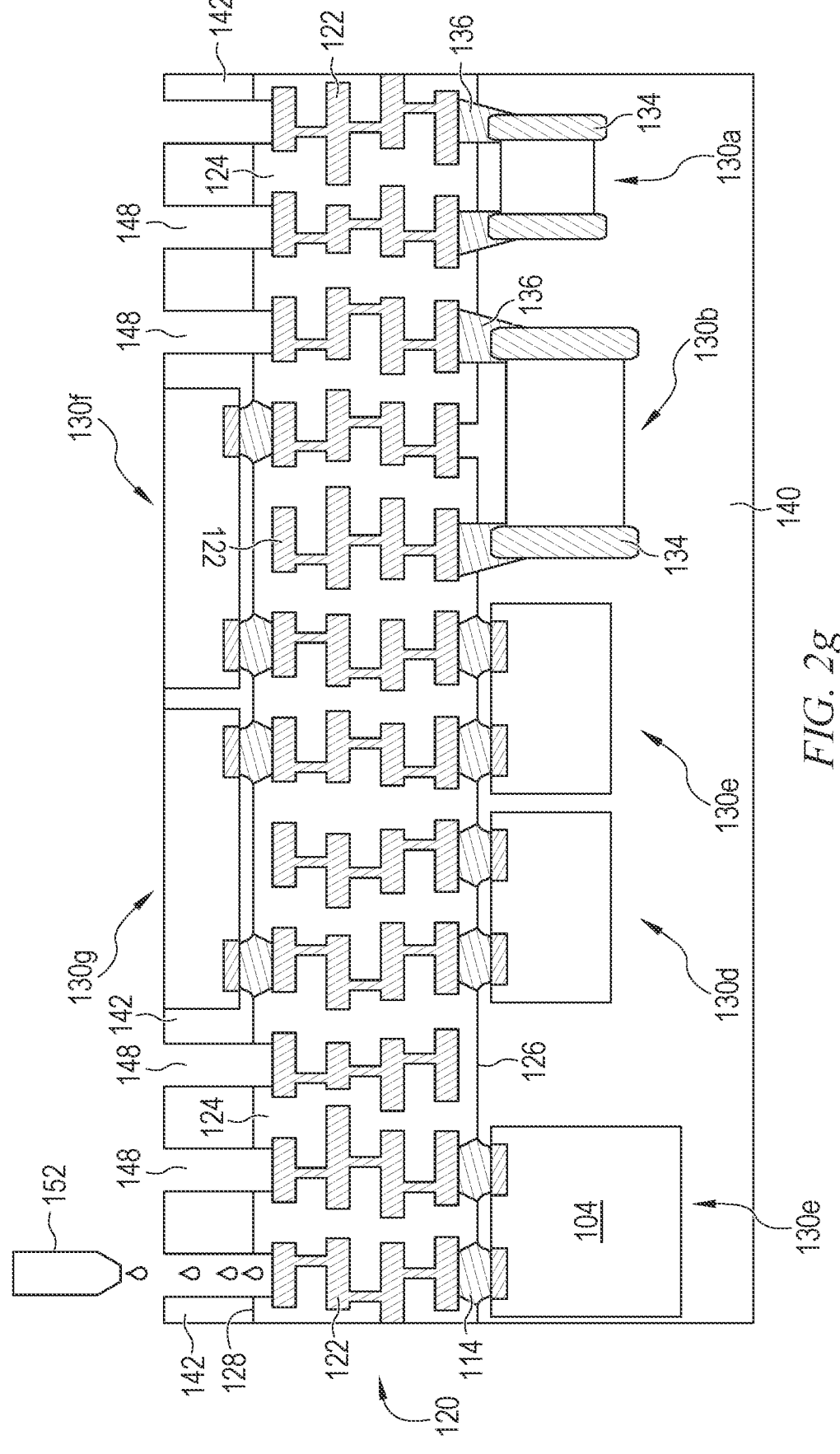

In FIG. 2g, electrically conductive material 150 is deposited in vias 148 using evaporation, electrolytic plating, electroless plating, ball drop, screen printing process, injector, or electrohydrodynamic (EHD) jet printing to provide a vertical electrical interconnect through encapsulant 142. In one embodiment, FIG. 2h shows electrically conductive material 150 deposited in vias 148 with injector 152 to form conductive posts or pillars 188.

Figure 2H:
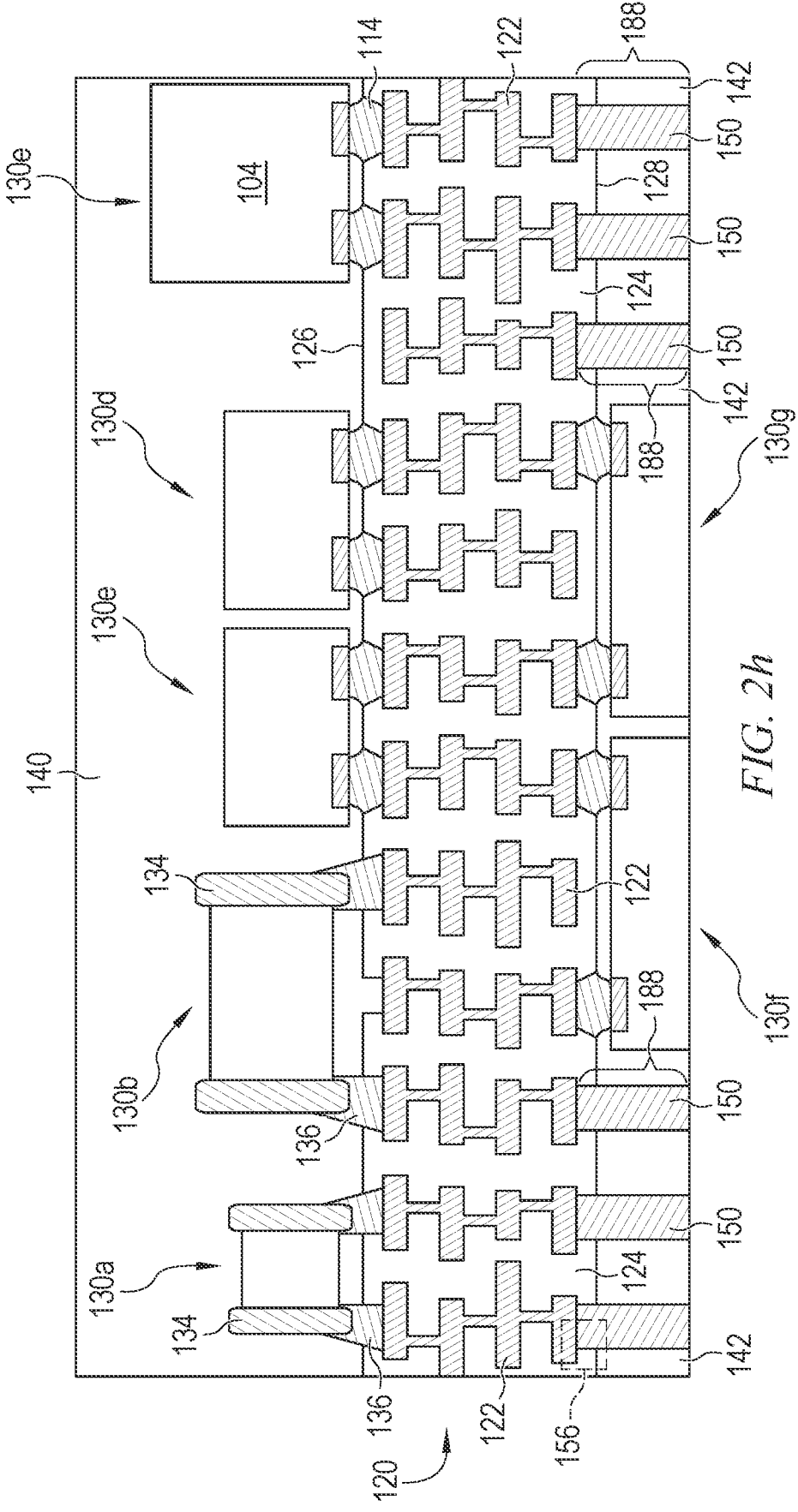
Figure 2I:
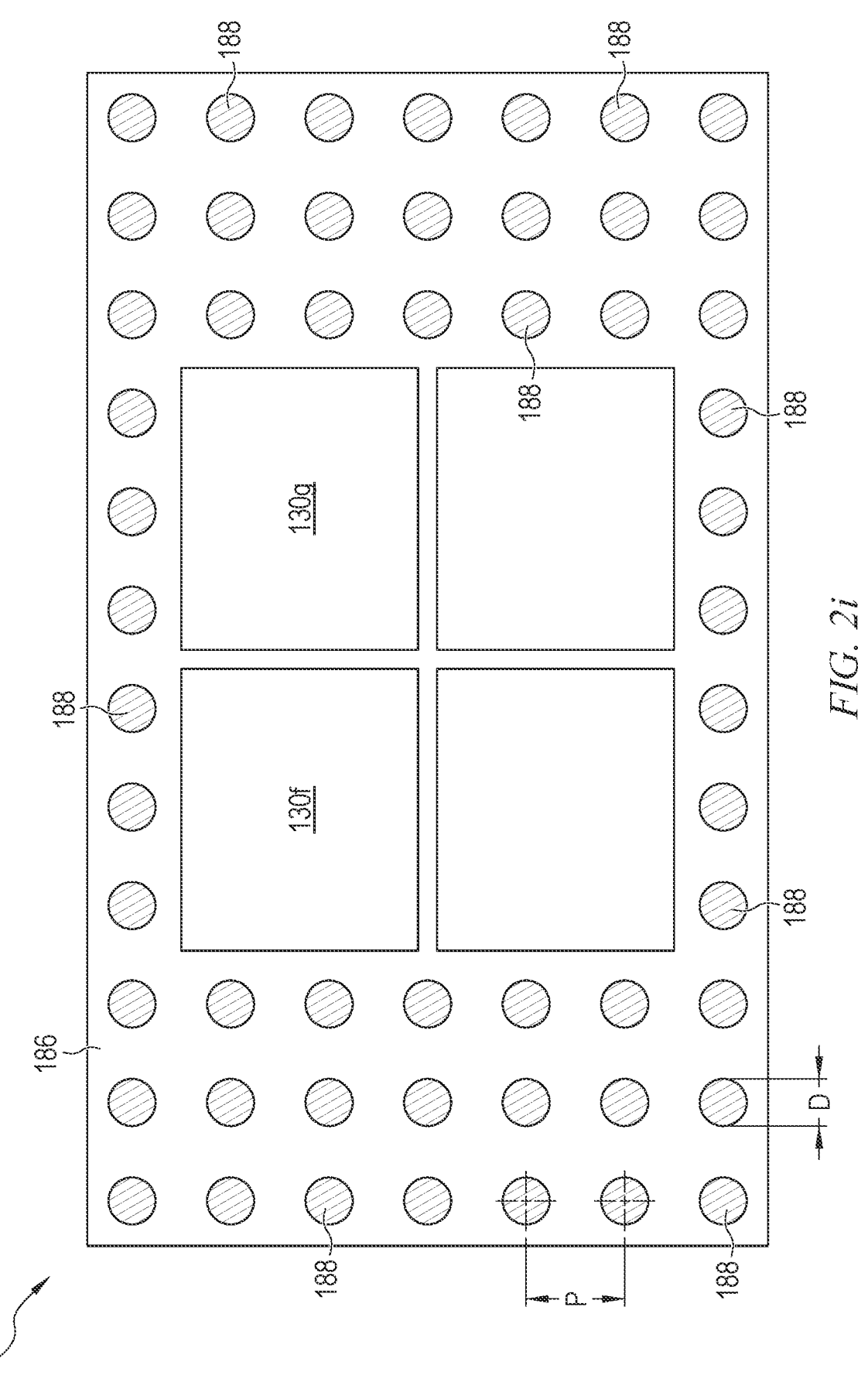
Figure 3:
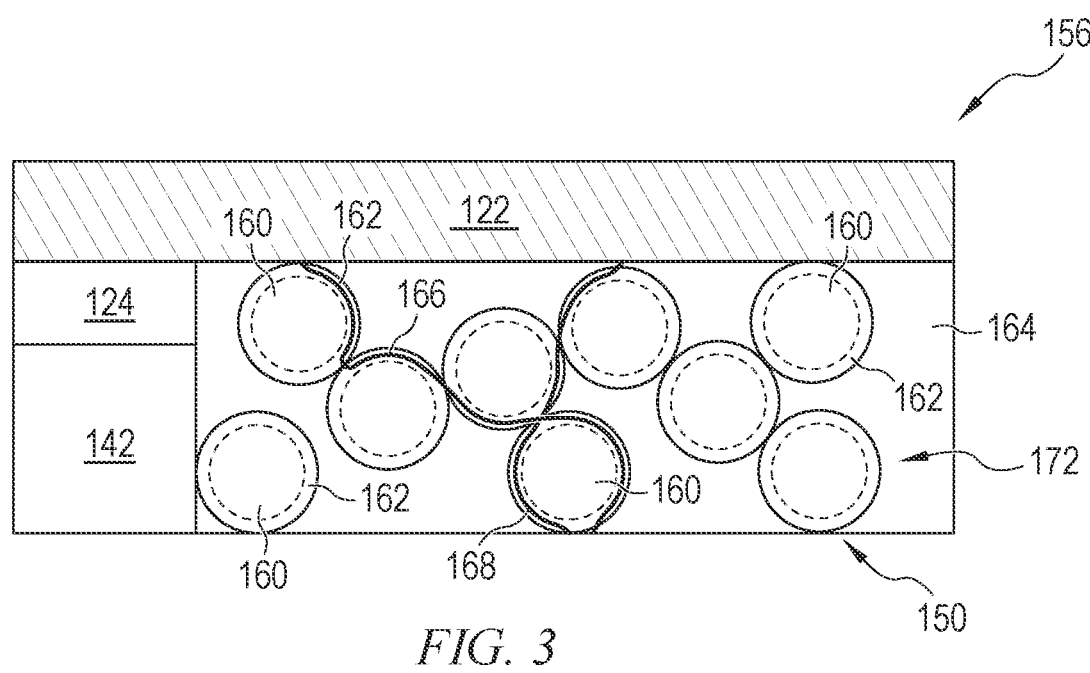
FIG. 3 illustrates graphene Cu core shells within a matrix.

FIG. 3 shows further detail of region or box 156 from FIG. 2h with a portion of conductive layer 122, insulating layer 124, conductive material 150, and encapsulant 142. In one embodiment, conductive material 150 includes a plurality of cores 160 with graphene coating 162 embedded within matrix 164. Matrix 164 can be a thermoset material, such epoxy resin or adhesive with filler containing alumina, Al, aluminum zinc oxide, or other material having good heat transfer and electrically conductive properties. Matrix 164 can be thermal grease such as silicon or polymer type such as polymethyl methacrylate (PMMA) or polyethylene terephthalate (PET). Matrix 164 can be a polymer or composite epoxy with dispersed graphene, carbon nanotubes, conductive polymers, and the like. For example, matrix 164 can be a Ag ink epoxy for conductive material 150.

In one embodiment, core 160 is Cu, Ni, phase change material (PCM), or other suitable metal or similar material. Cores 160 are arranged within matrix 164 so that most if not all graphene coatings 162 covering the core contact at least one adjacent graphene coating to form a continuous and connecting electrical path 166 of graphene coatings through conductive material 150. A first graphene coating 162 contacts a second adjacent graphene coating, which in turn contacts a third adjacent graphene coating, and so on, to form continuous and connecting electrical path 166. Cores 160 have sufficient density that most if not all the graphene coatings around the cores contact at least one graphene coating around an adjacent core, and typically contact graphene coating of multiple adjacent cores. Continuous and connecting path 168 shows an alternative electrical path through matrix 164. The continuous and connecting paths 166 and 168 are electrical paths for high electrical conductivity for conductive material 150.

Figure 4:
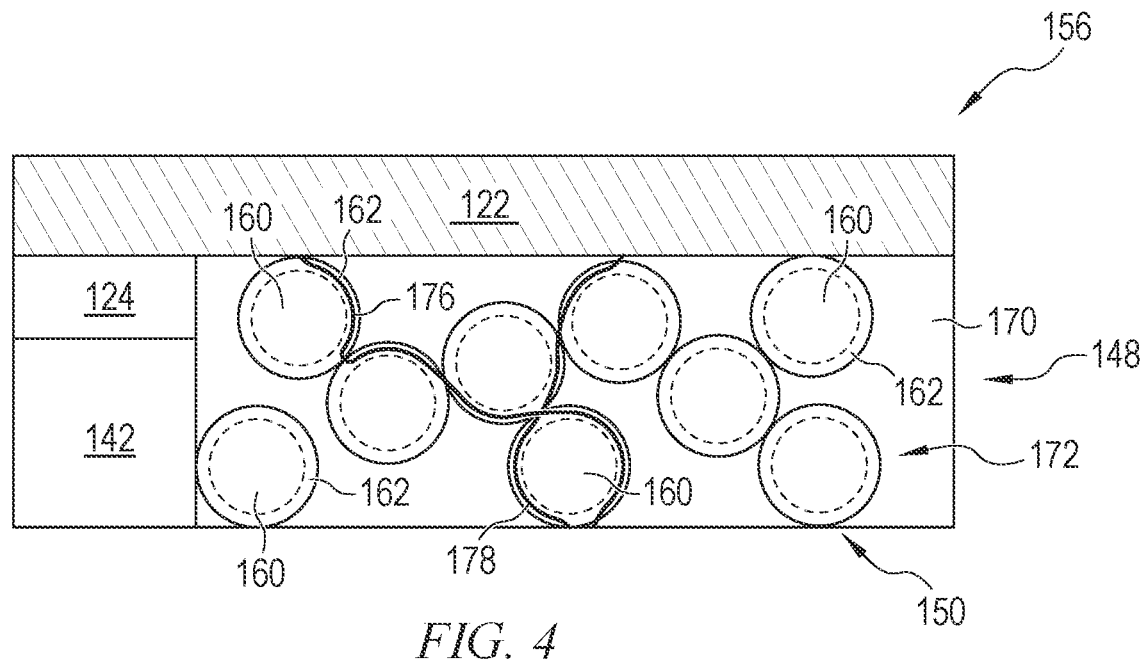
FIG. 4 illustrates another embodiment of graphene Cu core shells within a matrix.

FIG. 4 shows another embodiment of region or box 156 from FIG. 2g. In this case, matrix 170 is solder containing one or more elements of Sn, lead (Pb), or indium (In). Again, core 160 can be Cu, Ni, PCM, or other suitable metal or similar material. Each core 160, as embedded in matrix 170, is surrounded or covered by graphene coating or shell 162. In one embodiment, a graphene paste or ink is formed around a Cu core as graphene core shell 172.

Cores 160 are arranged within matrix 170 so that most if not all graphene coatings 162 covering the core contact at least one adjacent graphene coating to form a continuous and connecting path 176 of graphene coatings through conductive material 150. Graphene coating 162 of each core 160 contacts the graphene coating of an adjacent core. A first graphene coating 162 contacts a second adjacent graphene coating, which in turn contacts a third adjacent graphene coating, and so on, to form continuous and connecting path 176. Cores 160 have sufficient density that most if not all the graphene coatings around the cores contact at least one graphene coating around an adjacent core, and typically contact graphene coating of multiple adjacent cores. Continuous and connecting path 178 shows an alternative electrical path through matrix 170.

Figures 5A, 5B, 5C:
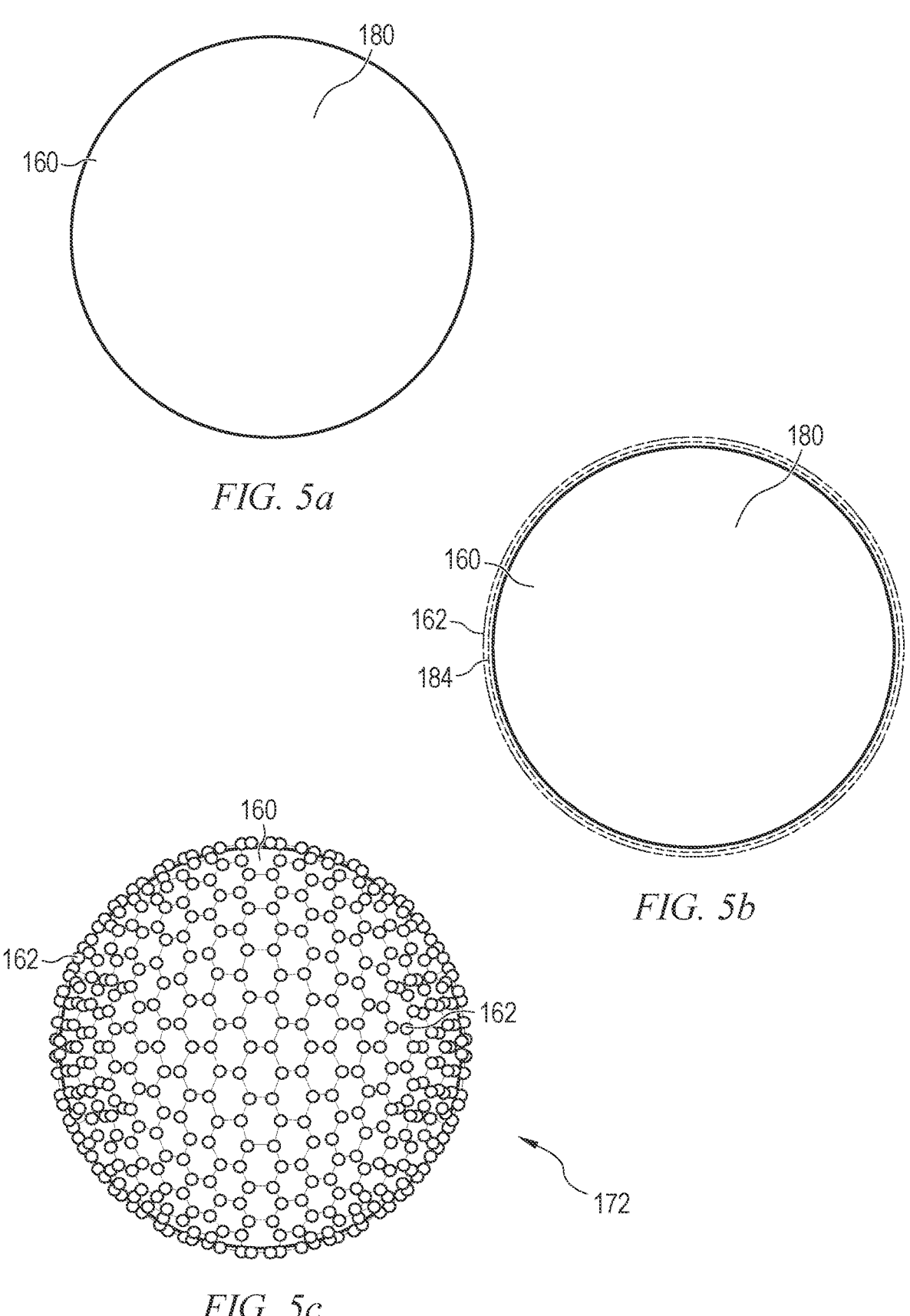
FIGS. 5a-5c illustrate a process of forming a graphene core shell.

FIGS. 5a-5c illustrate further detail of core 160, graphene coating 162, and graphene core shell 172. In one embodiment, core 160 is Cu, Ni, PCM, or other suitable metal or similar material. FIG. 5b illustrates graphene coating 162 formed over and around surface 180 of core 160. FIG. 5c illustrates further detail of graphene coating 162 formed as a mesh network around surface 180 of core 160, collectively graphene core shell 172. Graphene 162 is an allotrope of carbon with one or more layers of carbon atoms each arranged in a two-dimensional (2D) honeycomb lattice. Graphene coating 162 can be formed by CVD. Core 160 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene coating 162 on surface 180 of core 160. The release of carbon atoms over core 160 forms a continuous sheet of graphene coating 162. Additional information related to forming graphene coating by CVD is disclosed in U.S. Pat. No. 8,535,553, and hereby incorporated by reference.

Core 160 is PCM capable of phase change from solid to liquid phase or from liquid phase to solid phase within the operating temperature range of the semiconductor chip, e.g., 20-200° C. A first coating 184 is formed around PCM core 160, as shown in FIG. 5b and discussed in published Korean application KR101465616B1. The first coating 184 can be a polymer intermediate layer. A second coating 162 is formed over the first coating 184. Matrix 164, 179 with graphene covered cores is further disclosed in U.S. Pat. No. 10,421,123, and all are incorporated herein by reference.

The properties of graphene are summarized in Table 1, as follows:

TABLE 1

| Properties of graphene | |
| --- | --- |
| Parameter | |
| Electronic mobility | $2 \times 10^5$ cm$^2$ V$^{-1}$ s$^{-1}$ |
| Current density | $10^9$ A cm$^{-1}$ |
| Velocity of fermion (electron) | $10^6$ m s$^{-1}$ |
| Thermal conductivity | 900-5000 W m$^{-1}$ K$^{-1}$ |
| Tensile strength | 1.5 Tpa |
| Breaking strength | 42 N m$^{-1}$ |
| Transparency | 97.7% |
| Elastic limit | 20% |
| Surface area | 2360 m$^2$ g$^{-1}$ |

Graphene 162 has 100 times the electrical conductivity of Cu. Graphene 162 enables epoxy to exhibit electrical conductivity similar to Ag, while reducing or eliminating oxidation. Core shell 172 with Cu and graphene epoxy is low cost, as compared to sputtering. Graphene 162 has a low moisture permeability and a high thermal conductivity of 4000-5000 W m$^{-1}$ K$^{-1}$, 10 times higher than Cu at room temperature. Since carbon also has a good solderability and wettability of solder paste, conductive material 150 can be readily formed as conductive posts 188. Returning to FIG. 2i, conductive posts or pillars 188 are arranged across bottom surface 186 of DSmSiP 192 to have a low pitch P for high density electrical interconnect. In one embodiment, conductive posts 188 have a diameter or width D of 50-70 μm and pitch P of less 300 μm, preferably in the range of 100-140 μm. Graphene 162 exhibits a high degree of flexibility and remains stable against warpage. Conductive material 150 with graphene Cu shells 172 improves electrical conductivity, while lowering manufacturing cost.

Figure 2J:
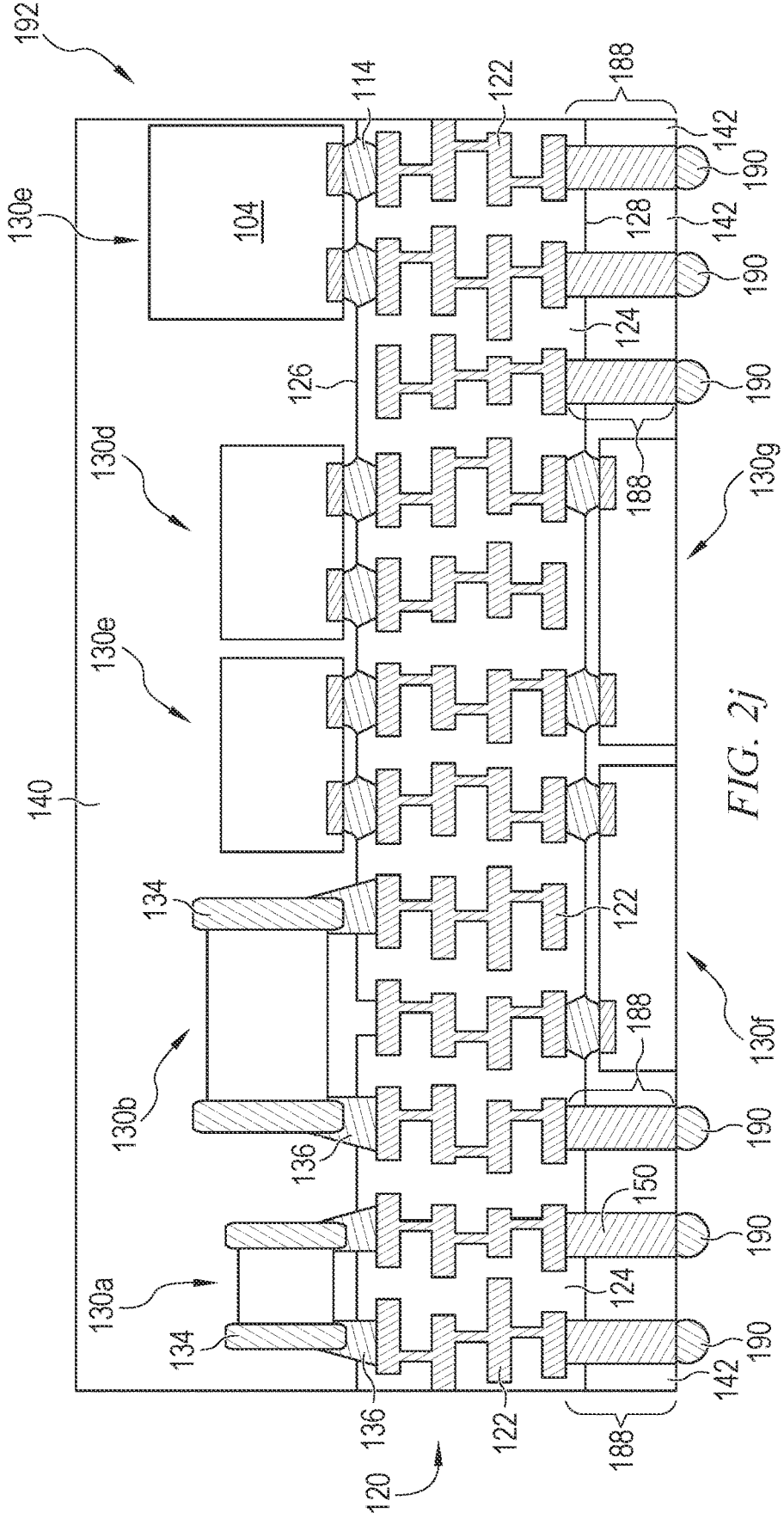

In FIG. 2j, an electrically conductive bump material is deposited over an exposed surface of conductive posts 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive post 188 using a suitable attachment or bonding process. In one embodiment, the bump material is reflowed by heating the material above its melting point to form balls or bumps 190. In one embodiment, bump 190 is formed over a UBM having a wetting layer, barrier layer, and adhesive layer. Bump 190 can also be compression bonded or thermocompression bonded to conductive post 188. Bump 190 represents one type of interconnect structure that can be formed over conductive post 190. The interconnect structure can also use bond wires, conductive paste, stud bump, micro bump, or other electrical interconnect.

The combination of substrate 120, electrical components 130a-130g, and encapsulant 140 and 142 constitutes SiP or DSmSiP 192. Conductive posts 188 uses graphene core shells 172 to reduce risk of electrical shorting in high density, low pitch applications, with fewer manufacturing steps. The graphene core shell posts 188 also increase signal transmission rate.

Electrical components 130a-130g in DSmSiP 192 may contain IPDs that are susceptible to or generate EMI, RFI, harmonic distortion, and inter-device interference. For example, the IPDs contained within electrical components 130a-130g provide the electrical characteristics needed for high-frequency applications, such as resonators, high-pass filters, low-pass filters, band-pass filters, symmetric Hi-Q resonant transformers, and tuning capacitors. In another embodiment, electrical components 130a-130g contain digital circuits switching at a high frequency, which could interfere with the operation of other IPDs.

Figure 6:
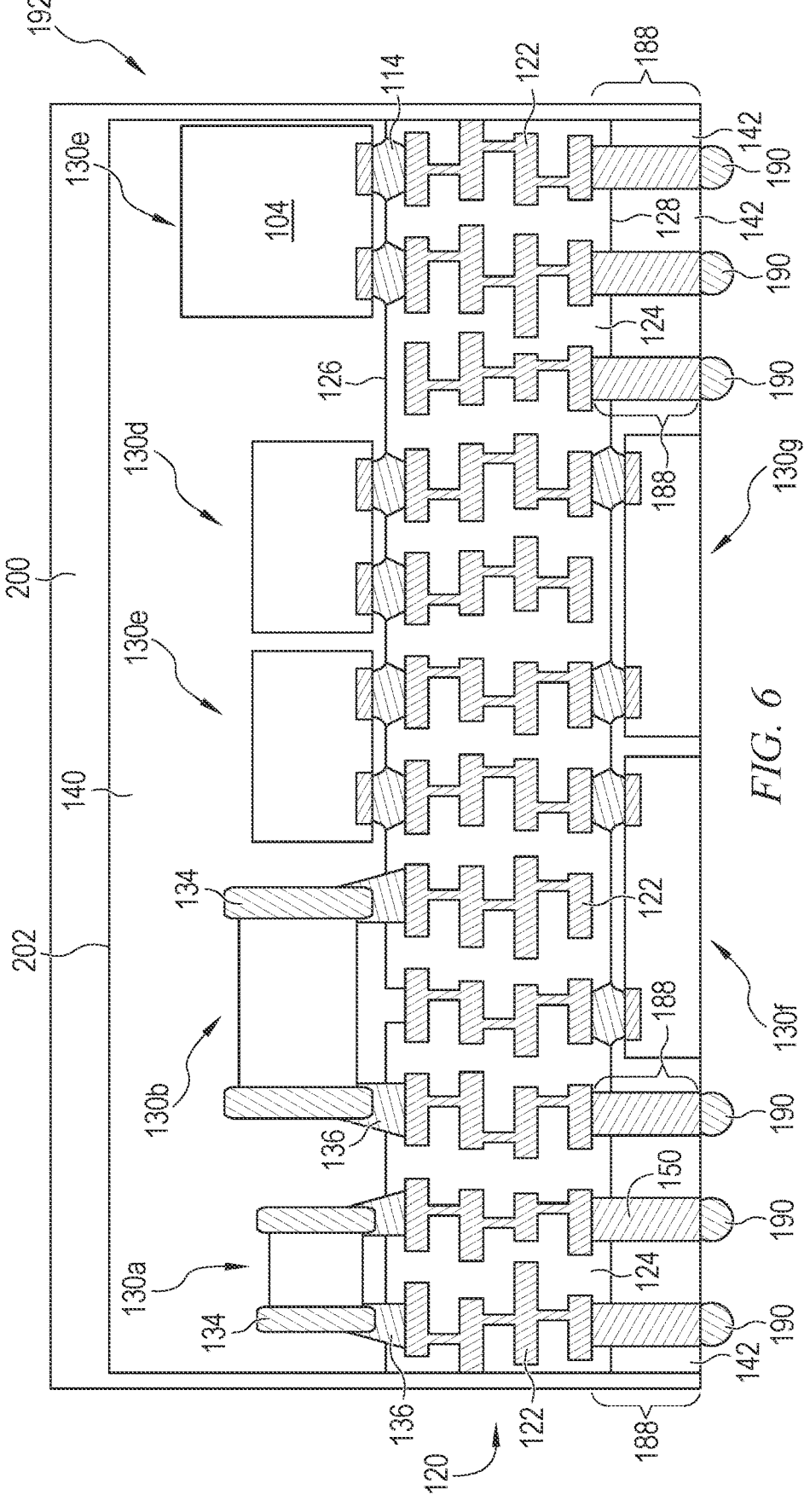
FIG. 6 illustrates a shielding layer over top and side surfaces of the DSmSiP.

To address EMI, RFI, harmonic distortion, and inter-device interference and continuing from FIG. 2h, a shielding layer 200 is formed over surface 202 of encapsulant 140 to reduce or inhibit the effects of EMI, RFI, and other inter-device interference, as shown in FIG. 6. Shielding layer 200 further extends down side surfaces of encapsulant 140, substrate 120, and encapsulant 142 to electrically connect to conductive layer 122. Shielding layer 200 can be one or more layers of a matrix, such as thermal set material or polymer, with graphene covered cores embedded within the matrix, see further description in FIGS. 3, 4, and 5a-5c. Shielding layer 200 with graphene Cu shell 172 improves electrical conductivity, while lowering manufacturing cost. Alternatively, shielding layer 200 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground. Shielding layer 200 isolates electrical components 130a-130g as necessary to address the effects of EMI, RFI, and other inter-device interference.

Figure 7:
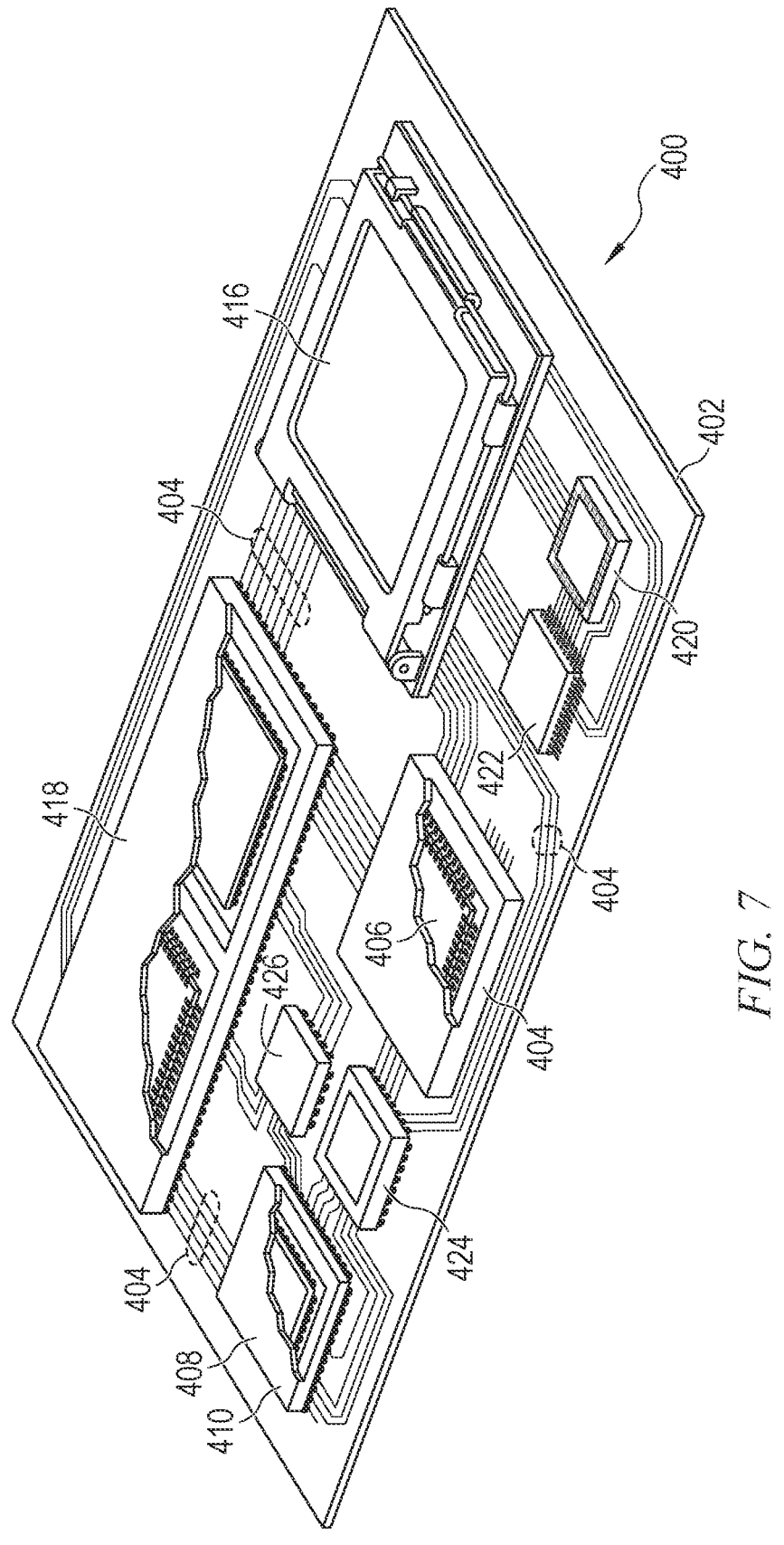
FIG. 7 illustrates a printed circuit board (PCB) with different types of packages disposed on a surface of the PCB.

FIG. 7 illustrates electrical device 400 having a chip carrier substrate or PCB 402 with a plurality of semiconductor packages disposed on a surface of PCB 402, including SIP 192. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 7, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a substrate;
an electrical component disposed over a first surface of the substrate;
a first encapsulant deposited over the electrical component and first surface of the substrate;
a second encapsulant deposited over a second surface of the substrate with a via formed in the second encapsulant; and
a conductive material including a plurality of graphene core shells deposited in the via in the second encapsulant to form a conductive post, wherein each one of the plurality of graphene core shells contacts another one of the plurality of graphene core shells to form a continuous conduction path between a first surface of the conductive post and a second surface of the conductive post opposite the first surface of the conductive post and the conductive material includes a plurality of cores covered by graphene and the graphene is formed as a mesh network in a honeycomb lattice over the cores and the graphene over the cores is in contact continuously between the first surface of the conductive post and the second surface of the conductive post to form the continuous path extending from the first surface of the conductive post to the second surface of the conductive post.

2. The semiconductor device of claim 1, wherein the graphene core shells include a copper core.

3. The semiconductor device of claim 2, wherein the graphene is formed as the mesh network in the honeycomb lattice over the copper core.

4. The semiconductor device of claim 1, wherein the conductive material further includes a matrix to embed the graphene core shells.

5. The semiconductor device of claim 1, wherein the conductive material includes thermoset material or polymer or composite epoxy type matrix and the graphene core shells are embedded within the thermoset material or polymer or composite epoxy type matrix.

6. A semiconductor device, comprising:

a substrate;

an encapsulant deposited over a surface of the substrate with a via formed in the encapsulant; and a conductive material including a plurality of graphene core shells deposited in the via in the encapsulant to form a conductive post, wherein each of the graphene core shells is in contact with an adjacent graphene core shell to form a continuous path extending from a first surface of the conductive post to a second surface of the conductive post and the conductive material includes a plurality of cores covered by graphene and the graphene is formed as a mesh network over the cores and the graphene over the cores is in contact continuously between the first surface of the conductive post and the second surface of the conductive post to form the continuous path extending from the first surface of the conductive post to the second surface of the conductive post.

7. The semiconductor device of claim 6, wherein the graphene core shells include a copper core.

8. The semiconductor device of claim 7, wherein the graphene is formed as the mesh network in the honeycomb lattice over the copper core.

9. The semiconductor device of claim 6, wherein the conductive material further includes a matrix to embed the graphene core shells.

10. The semiconductor device of claim 6, wherein the conductive material includes thermoset material or polymer or composite epoxy type matrix and the graphene core shells are embedded within the thermoset material or polymer or composite epoxy type matrix.

11. The semiconductor device of claim 6, further including an electrical component disposed over the substrate.

12. A method of making a semiconductor device, comprising:

providing a substrate;

disposing an electrical component over a first surface of the substrate;

depositing a first encapsulant over the electrical component and first surface of the substrate;

depositing a second encapsulant over a second surface of the substrate with a via formed in the second encapsulant; and depositing a conductive material including a plurality of graphene core shells in the via in the second encapsulant to form a conductive post, wherein the graphene core shells are each interconnected as one graphene core shell of the plurality of graphene core shells contacts another graphene core shell of the plurality of graphene core shells to form a continuous conduction path within the conductive post and the conductive material includes a plurality of cores covered by graphene and the graphene is formed as a mesh network over the cores and the graphene over the cores is in contact continuously between a first surface of the conductive post and a second surface of the conductive post to form the continuous path extending from the first surface of the conductive post to the second surface of the conductive post.

13. The method of claim 12, wherein the graphene core shells include a copper core.

14. The method of claim 13, wherein the graphene is formed as the mesh network in the honeycomb lattice over the copper core.

15. The method of claim 12, wherein the conductive material further includes a matrix to embed the graphene core shells.

16. The method of claim 12, wherein the conductive material includes thermoset material or polymer or composite epoxy type matrix and the graphene core shells are embedded within the thermoset material or polymer or composite epoxy type matrix.

17. A method of making a semiconductor device, comprising:

providing a substrate;

depositing an encapsulant over a surface of the substrate with a via formed in the encapsulant; and depositing a conductive material including a plurality of graphene core shells in the via in the encapsulant to form a conductive post, wherein the graphene core shells are interconnected to form a continuous conduction path within the conductive post and the conductive material includes a plurality of cores covered by graphene and the graphene is formed as a mesh network over the cores and the graphene over the cores is in contact continuously between a first surface of the conductive post and a second surface of the conductive post to form the continuous path extending from the first surface of the conductive post to the second surface of the conductive post.

18. The method of claim 17, wherein the graphene core shells include a copper core.

19. The method of claim 18, wherein the graphene is formed as the mesh network in the honeycomb lattice over the copper core.

20. The method of claim 17, wherein the conductive material further includes a matrix to embed the graphene core shells.

21. The method of claim 17, wherein the conductive material includes thermoset material or polymer or composite epoxy type matrix and the graphene core shells are embedded within the thermoset material or polymer or composite epoxy type matrix.

* * * * *